United States Patent
Lo et al.

(10) Patent No.: US 7,203,264 B2
(45) Date of Patent: Apr. 10, 2007

(54) HIGH-STABILITY SHIFT CIRCUIT USING AMORPHOUS SILICON THIN FILM TRANSISTORS

(75) Inventors: Shin-Tai Lo, Miaoli County (TW); Yi-Chin Lin, Taichung (TW); Ruey-Shing Weng, Kaohsiung (TW)

(73) Assignee: Wintek Corporation, Taichung (TW)

( * ) Notice: Subject to any disclaimer, the term of this patent is extended or adjusted under 35 U.S.C. 154(b) by 95 days.

(21) Appl. No.: 11/167,197

(22) Filed: Jun. 28, 2005

(65) Prior Publication Data

US 2006/0291610 A1 Dec. 28, 2006

(51) Int. Cl.
*G11C 19/00* (2006.01)
(52) U.S. Cl. ............................ 377/64; 377/68; 345/100
(58) Field of Classification Search ................... None
See application file for complete search history.

(56) References Cited

U.S. PATENT DOCUMENTS

| 6,339,631 | B1 * | 1/2002 | Yeo et al. ...................... 377/64 |
| 6,690,347 | B2 | 2/2004 | Jeon et al. |
| 6,845,140 | B2 * | 1/2005 | Moon et al. ................... 377/78 |
| 7,038,653 | B2 * | 5/2006 | Moon .......................... 345/100 |

\* cited by examiner

*Primary Examiner*—Tuan T. Lam
(74) *Attorney, Agent, or Firm*—Birch, Stewart, Kolasch & Birch, LLP

(57) ABSTRACT

A high-stability shift circuit using amorphous silicon thin film transistors, which utilizes two out-of-phase pulses to control the operating mechanism and the bias-relations among transistors in the shift circuit. This makes the transistors under the driving conditions of positive/negative-alternating biases so as to restrain the voltage shift of the transistors such that the threshold voltage will not excessively increase along with the increasing operating time. This can not only increase the lifetime of the amorphous silicon thin film transistors but also extend the operating time of the shift circuit.

5 Claims, 8 Drawing Sheets

HIGH-STABILITY SHIFT CIRCUIT USING AMORPHOUS SILICON THIN FILM TRANSISTORS

FIELD OF THE INVENTION

The present invention relates to a scanning shift circuit whose components are amorphous silicon thin film transistors. This shift circuit has the mechanism for restraining the threshold voltage shift of the amorphous silicon thin film transistors, reducing the extent of the threshold voltage shift, so as to increase the stability of the scanning shift circuit and to extend the lifetime of the shift circuit.

BACKGROUND OF THE INVENTION

In recent years, the technology of thin film transistor panel is making progress continuously, which includes the driving circuit been integrated on panels. Such as the SOG (system on glass) technology can be actualized by technologies of a-Si (amorphous silicon) and LTPS (low temperature polysilicon). The major difference between a LTPS TFT and an a-Si TFT is the complexity of the manufacturing process and the electrical characteristics. A LTPS TFT has a higher carrier-mobility whereas its manufacturing process is more complicated. By contrast, a-Si TFT has a lower carrier-mobility than LTPS, but its manufacturing process is simpler and well developed, and therefore an a-Si TFT has a better competitiveness in terms of cost.

However, due to the limit of manufacturing ability, the threshold voltage (Vth) for the manufactured a-Si TFT elements that follows the affection of the bias stress increases gradually. This is an important reason why a SOG panel cannot be actualized by an a-Si TFT. In the well known technologies, several amorphous silicon thin film transistors of a scanning shift circuit whose components are amorphous silicon thin film transistors have the problem of Vth shift. Along with the increasing operating time, the Vth shift severely affects the normal operation of the scanning shift circuit, even the scanning shift circuit will fail at last.

As is known to all, U.S. Pat. No. 6,690,347 entitled "SHIFT REGISTER AND LIQUID CRYSTAL DISPLAY USING THE SAME" (Feb. 10, 2004) proposed a scanning shift circuit. Please refer to FIGS. 6 and 7 that are the schematic diagram and the timing diagram for the shift register circuit of the patent respectively. As shown in FIG. 7, the bias voltage value for gate-source voltages (Vgs2, Vgs4) of transistors NT2 and NT4 are zero only in the two pulses time when the input terminal IN is at a high-level state (VDD) and when the output terminal OUT is at a high-level state (VDD). The bias voltage value for gate-source voltages (Vgs2, Vgs4) of transistors NT2 and NT4 are positive in the rest time. Consequently, severe threshold voltage shift for transistors NT2 and NT4 are caused due to the long-term positive bias, as shown in FIG. 8. The threshold voltages for transistors NT2 and NT4 rise gradually along with the operating time.

When severe threshold voltage shift for transistors NT2 and NT4 are caused, the value of the threshold voltage is much higher than the normal value, which results in the following problems:

1. When the output terminal OUT is kept at a low-level state (VSS), the impedance between the output terminal OUT and the power voltage VSS should be kept at low by way of turning on the transistor NT2 continuously. However, when the threshold voltage of transistor NT2 is increasing, the impedance between the output terminal OUT and the power voltage VSS is increasing at the same time. As a result, the output terminal OUT is easily affected by other signals or noises such that the output terminal OUT cannot be kept at a low-level state (VSS). Therefore, the scanning signal provided by the shift circuit will be distorted and then the driving for the display panel will be misacted.

2. When the output terminal OUT is kept at a low-level state (VSS), for avoiding the high-level signal (VDD) of the clock-pulse signal CK to affect the low-level signal (VSS) of the output terminal OUT through the transistor NT1, the node P1 should be kept at a low-level state (VSS) so as to assure that the transistor NT1 is at a cut-off state. Keeping the node P1 at a low-level state (VSS) is achieved by turning on the transistor NT4 continuously. However, when the threshold voltage of transistor NT4 is increasing, the impedance between the node P1 and the power voltage VSS is increasing at the same time. As a result, the node P1 is easily affected by other signals or noises such that the node P1 cannot be kept at a low-level state (VSS). Therefore, the high-level signal (VDD) of the clock-pulse signal CK may affect the low-level signal (VSS) of the output terminal OUT through the transistor NT1 so that the scanning signal provided by the shift circuit will be distorted and then the driving for the display panel will be misacted.

SUMMARY OF THE INVENTION

Consequently, the main purpose of the current invention is to add a recovery mechanism for restraining the threshold voltage shift of the a-Si TFTs by the innovative circuit so as to avoid that the a-Si TFTs affect the scanning signal of the shift register due to the threshold voltage shift.

Another purpose of the current invention is to reduce the extent of the threshold voltage shift of the a-Si TFTs by using the aforementioned recovery mechanism so as to promote the stability of the scanning shift circuit, to increase the lifetime of the a-Si TFTs, and to extend the operating time of the shift circuit.

The present invention is applied to shift register circuits that are composed of amorphous silicon thin film transistors. The invention is a scanning driving circuit that can be integrated to a glass substrate. The shift register of this invention is composed of several stages. The stages are connected in serial and send the output signals G1, G2, G3, G4, . . . to the gate lines in the panel. The two power sources are a high-level supply voltage and a low-level supply voltage. The input signals include the first clock-pulse signal, the second clock-pulse signal, and the start signal.

Initially, a serial-start signal is fed into the first stage, and input signals for the rest stages are from the output signal of the next-former stage individually. The first clock-pulse terminal and the second clock-pulse terminal for the odd stages of the shift register circuit are respectively supplied by the first clock-pulse signal and the second clock-pulse signal that are out-of-phase to each other. Input signals for the even stages are reversed to the odd stages, i.e. the first clock-pulse terminal and the second clock-pulse terminal for the even stages of the shift register circuit are supplied by the aforementioned second clock-pulse signal and the first clock-pulse signal, respectively. The input terminals also include a reset terminal that receives the output signal of the next-latter stage.

The inner circuit for odd stages of this invention includes the first transistor whose gate connects to the input terminal and the drain connects to the high-level supply voltage; the second transistor whose gate connects to the reset terminal, the source connects to the first clock-pulse terminal, and the drain and the source of the first transistor form the first node; the third transistor whose drain connects to the first node and the source connects to the second clock-pulse terminal.

The fourth transistor whose gate connects to the first clock-pulse terminal, the drain connects to the high-level supply voltage, and the source and the gate of the third transistor form the second node. The fifth transistor whose gate connects to the first node, the drain connects to the second node, and the source connects to the low-level supply voltage; the sixth transistor whose gate connects to the second clock-pulse terminal, the drain connects to the first clock-pulse terminal, and the source connects to the second node.

The seventh transistor whose gate connects to the first node, the drain connects to the first clock-pulse terminal, the source connects to the output terminal of this stage, and a capacitor is connected between the first node and the output terminal. The eighth transistor whose gate connects to the second node, the drain connects to the output terminal, and the source connects to the second clock-pulse terminal; the ninth transistor whose gate connects to the second clock-pulse terminal, the drain connects to the output terminal, and the source connects to the first clock-pulse terminal.

By this, when the two out-of-phase signals: the first clock-pulse and the second clock-pulse are fed into the shift circuit of this invention, the driving conditions for the third, eighth, and ninth transistor are positive/negative-alternating biases. The positive/negative-alternating biases can restrain the shift of the threshold voltage such that the threshold voltage of the transistor will not excessively increase along with the increasing operating time. Accordingly, this can not only increase the lifetime of the amorphous silicon thin film transistors, extend the operating time of the shift circuit, but also can avoid that the a-Si TFTs affect the scanning signal of the whole shift register due to the threshold voltage shift.

DETAILED DESCRIPTION OF THE PREFERRED EMBODIMENTS

The detailed descriptions for content and technology of this invention associate with figures are as follows.

Figure 1:
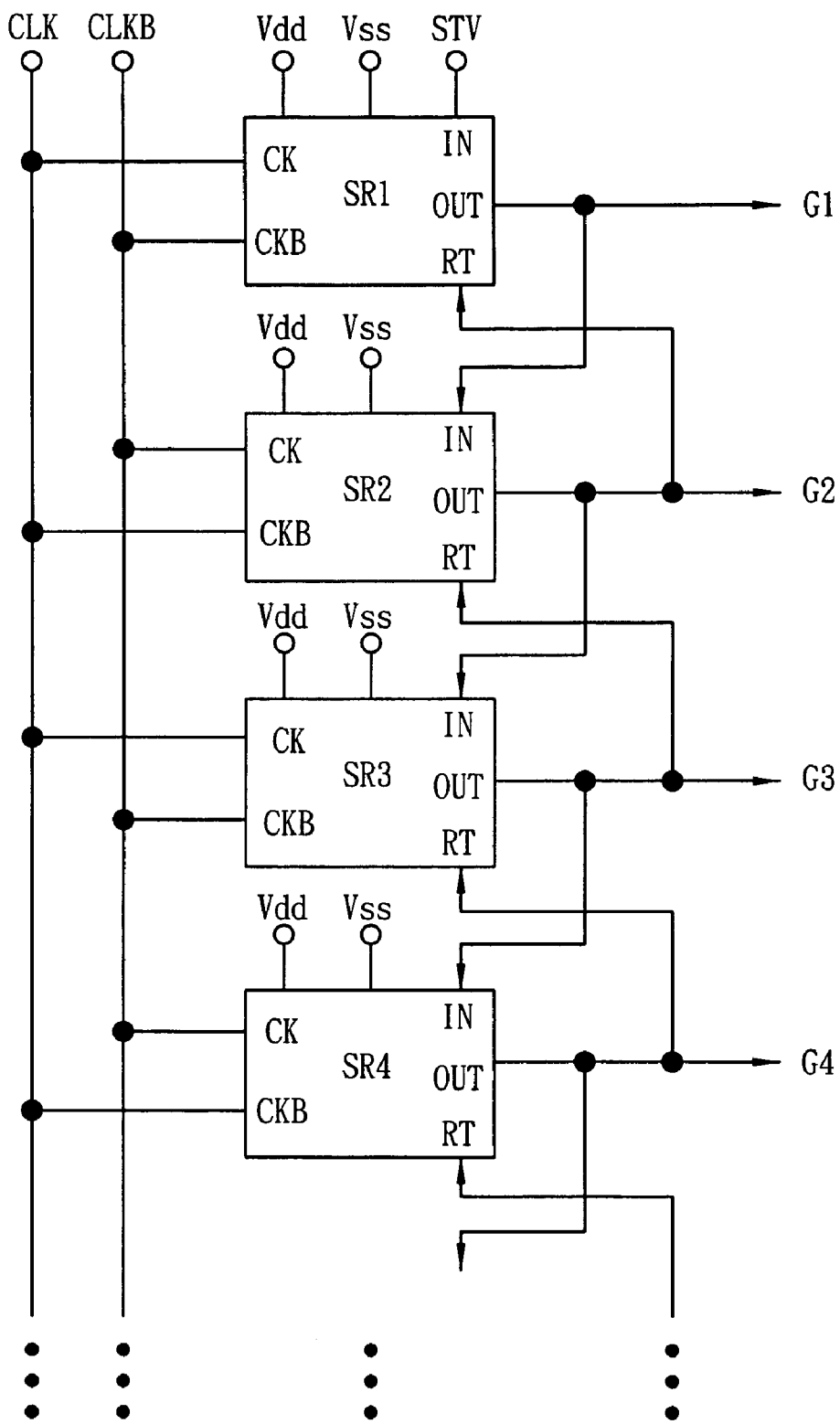
FIG. 1 is the block diagram for the shift register of the current invention.
Figure 2:
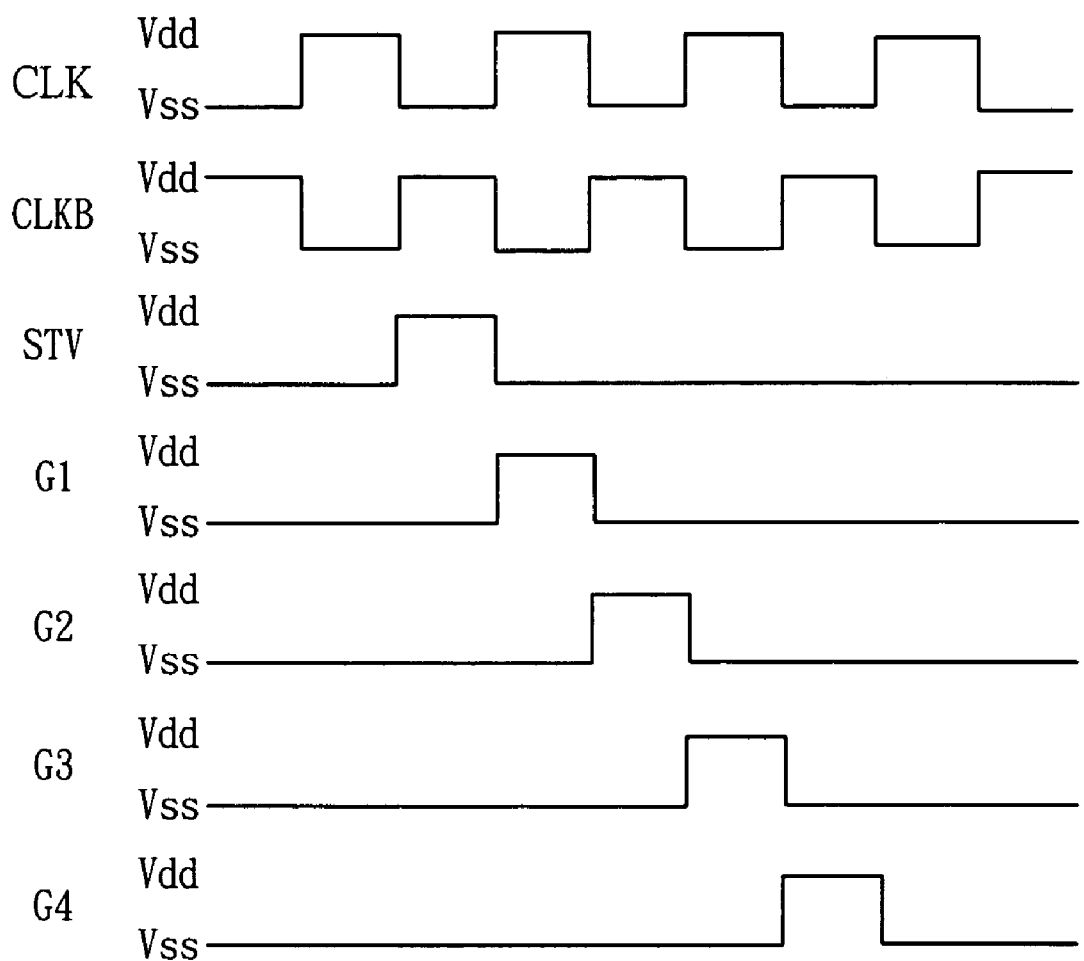
FIG. 2 is the timing diagram for the output and input signals of FIG. 1.

Please refer to FIGS. 1 and 2, which are the block diagram and the timing diagram for the output and input signals, respectively, for the shift register of the current invention. As shown in the figures, the present invention is applied to shift register circuits that are composed of amorphous silicon thin film transistors. The invention is a scanning driving circuit that can be integrated to a glass substrate. The shift register of this invention is composed of several stages. The stages are connected in serial and send the output signals G1, G2, G3, G4, . . . to the gate lines in the panel. The two power sources are a high-level supply voltage Vdd and a low-level supply voltage Vss. The input signals include the first clock-pulse signal CLK and the second clock-pulse signal CLKB, they are out-of-phase to each other, and the start signal STV.

Initially, a serial-start signal STV is fed into the first stage SR1, and input signals IN for the rest stages are from the output signal of the next-former stage (G1, G2, G3, G4, . . . ) individually. The first clock-pulse terminal CK and the second clock-pulse terminal CKB for the odd stages of the shift register circuit are respectively supplied by the first clock-pulse signal CLK and the second clock-pulse signal CLKB that are out-of-phase to each other. The input signal for the first clock-pulse terminal CK of the even stages of the shift register circuit is changed to the second clock-pulse signal CLKB, and the input signal for the second clock-pulse terminal CKB is changed to the first clock-pulse signal CLK. The input terminal also includes a reset terminal RT that receives the output signal of the next-latter stage.

The input signal includes the first clock-pulse signal CLK, the second clock-pulse signal CLKB, and the start signal STV. The timing relation among the input signals and the output signals G1, G2, G3, and G4 are shown as FIG. 2.

Figure 3:
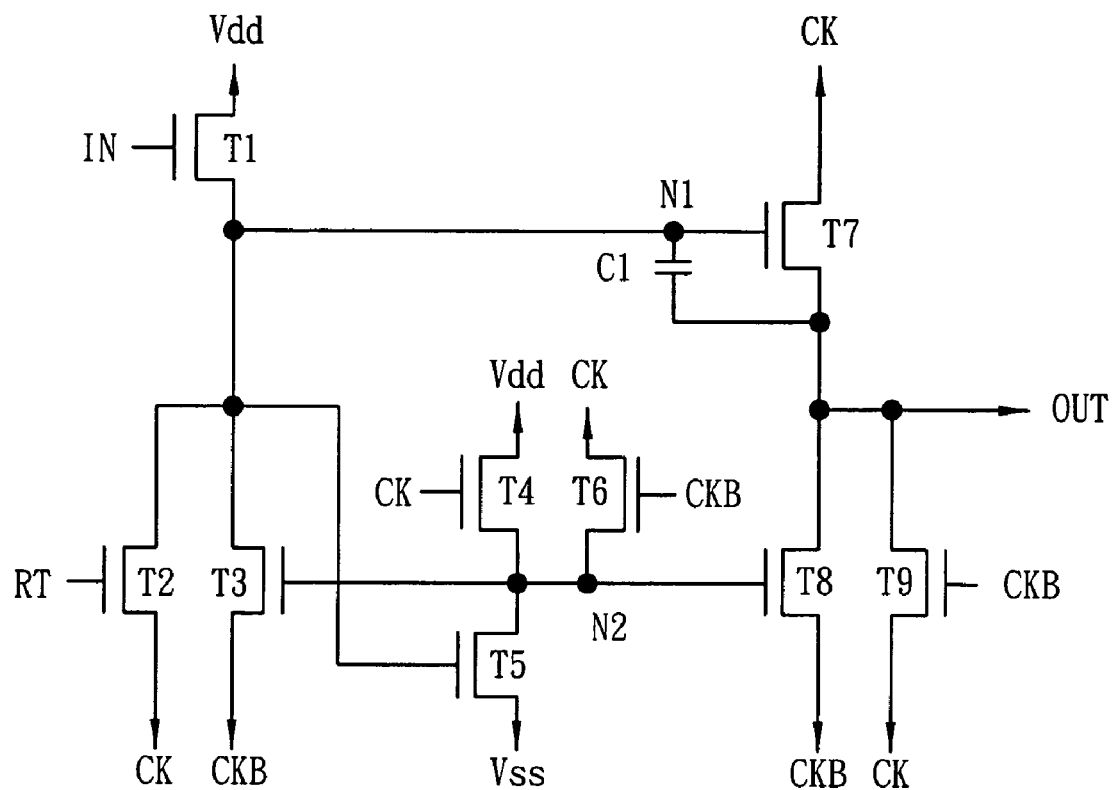
FIG. 3 is the schematic circuit for the current invention.

Please refer to FIG. 3, which is an odd stage of the shift register circuit, the first clock-pulse terminal CK and the second clock-pulse terminal CKB are respectively supplied by the first clock-pulse signal CLK and the second clock-pulse signal CLKB that are out-of-phase to each other. The inner circuit includes:

The first transistor T1 whose gate connects to the input terminal IN and the drain connects to the high-level supply voltage Vdd; the second transistor T2 whose gate connects to the reset terminal RT, the source connects to the first clock-pulse terminal CK, and the drain and the source of the first transistor T1 form the first node N1; the third transistor T3 whose drain connects to the first node N1 and the source connects to the second clock-pulse terminal CKB.

The fourth transistor T4 whose gate connects to the first clock-pulse terminal CK, the drain connects to the high-level supply voltage Vdd, and the source and the gate of the third transistor T3 form the second node N2. The fifth transistor T5 whose gate connects to the first node N1, the drain connects to the second node N2, and the source connects to the low-level supply voltage Vss; at this time, because the conducting resistance of the fifth transistor T5 should less than the conducting resistance of the fourth transistor T4 so the size of the fifth transistor T5 should larger than the size of the fourth transistor T4, for example 5:1 in size ratio. The sixth transistor T6 whose gate connects to the second clock-pulse terminal CKB, the drain connects to the first clock-pulse terminal CK, and the source connects to the second node N2.

The seventh transistor T7 whose gate connects to the first node N1, the drain connects to the first clock-pulse terminal CK, the source connects to the output terminal OUT of this stage, and a capacitor C1 is connected between the first node N1 and the output terminal OUT.

The eighth transistor T8 whose gate connects to the second node N2, the drain connects to the output terminal OUT, and the source connects to the second clock-pulse terminal CKB; the ninth transistor T9 whose gate connects to the second clock-pulse terminal CKB, the drain connects to the output terminal OUT, and the source connects to the first clock-pulse terminal CK.

However, when the abovementioned circuit is an even stage, the input signal for the first clock-pulse terminal CK of the even stage is changed to the second clock-pulse signal CLKB, and the input signal for the second clock-pulse terminal CKB of the even stage is changed to the first clock-pulse signal CLK.

Figure 4:
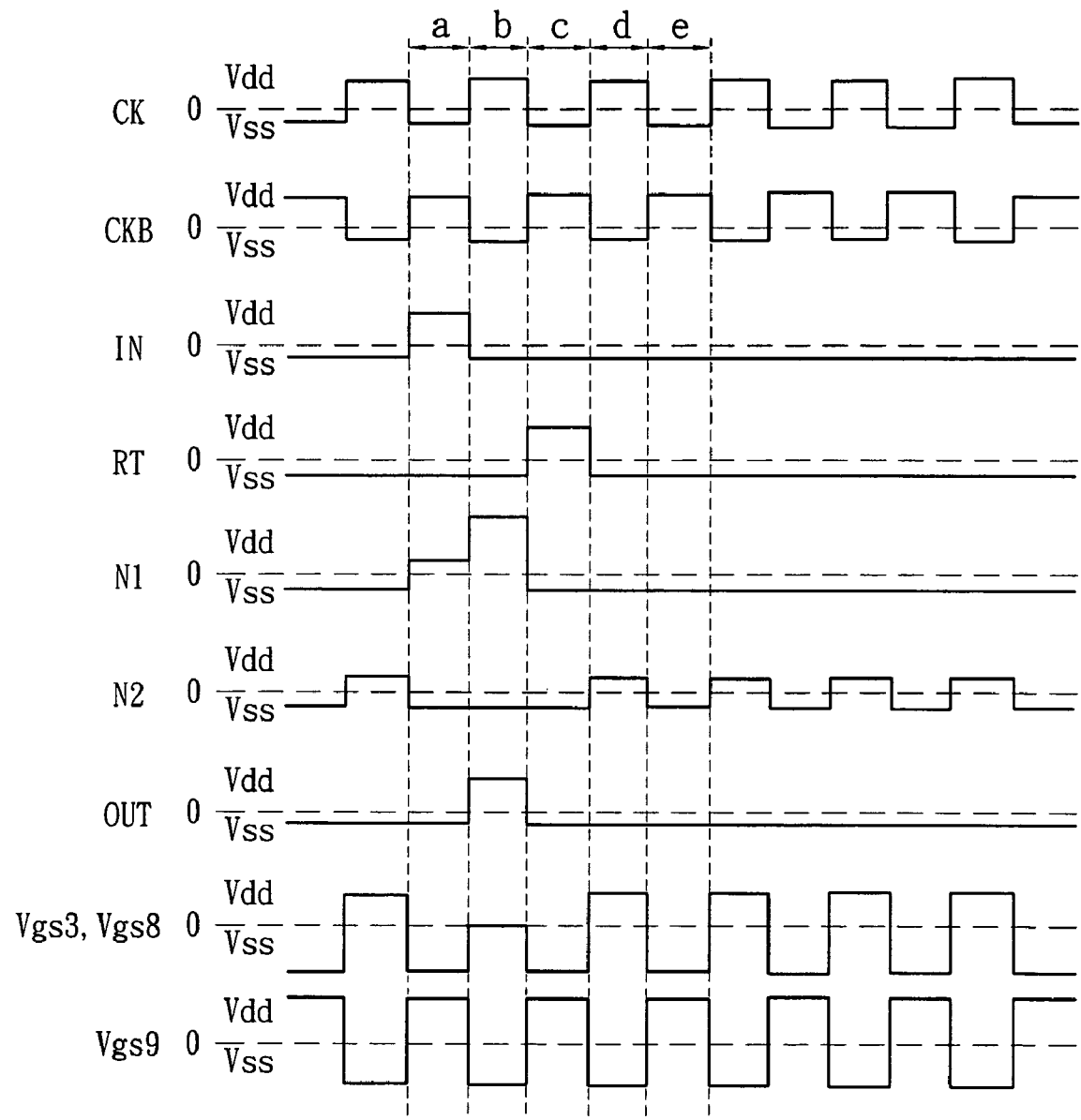
FIG. 4 is the timing diagram for FIG. 3.

The action of the circuit is described below, which is according to the phases between terminals and nodes of the circuit. The voltage variation is shown in FIG. 4.

Phase a:

The trigger-pulse of the input terminal IN and the pulse signal of the second clock-pulse terminal CKB are in-phase, i.e. when the input terminal IN generates a trigger-pulse which is a high-level voltage (Vdd), the second clock-pulse terminal CKB is a high-level voltage (Vdd) while the first clock-pulse terminal CK is a low-level voltage (Vss). At this time, the voltage of the first node N1 will rise from the low-level supply voltage Vss to the difference voltage of the high-level supply voltage Vdd and the threshold voltage of the first transistor T1 Vth1, i.e. (Vdd−Vth1). The voltage of the output terminal OUT will be kept at a low-level voltage (Vss).

Because, during the pulse period when the input terminal IN is a high-level voltage (Vdd), the first transistor T1 turns on resulting from the input terminal IN is a high-level voltage (Vdd); the second transistor T2 cuts off resulting from the reset terminal RT is a low-level voltage (Vss); the fourth transistor T4 cuts off resulting from the first clock-pulse terminal CK is a low-level voltage (Vss); the sixth transistor T6 turns on resulting from the second clock-pulse terminal CKB is a high-level voltage (Vdd). At this time, because the first clock-pulse terminal CK is a low-level voltage (Vss) so the voltage of the second node N2 drops from the difference of the original high-level voltage (Vdd) and the threshold voltage of the fourth transistor T4 to the low-level voltage (Vss).

Meanwhile, because the voltage of the second node N2 is a low-level voltage (Vss), so the third transistor T3 cuts off. Because the source of the third transistor T3 connects to the second clock-pulse terminal CKB, and the second clock-pulse terminal CKB is a high-level voltage (Vdd) at this time, so the bias condition for the gate-source voltage (Vgs3) of the third transistor T3 is a negative bias. Similarly, because the voltage of the second node N2 is a low-level voltage (Vss), so the eighth transistor T8 cuts off. Because the source of the eighth transistor T8 connects to the second clock-pulse terminal CKB, and the second clock-pulse terminal CKB is a high-level voltage (Vdd) at this time, so the bias condition for the gate-source voltage (Vgs8) of the eighth transistor T8 is a negative bias.

At the same time, because the voltage of the first node N1 rises to (Vdd−Vth1), so the fifth transistor T5 and the seventh transistor T7 turn on, and the first clock-pulse terminal CK is low.

The ninth transistor T9 turns on due to the second clock-pulse terminal CKB is a high-level voltage (Vdd). At this time, the first clock-pulse terminal CK is a low-level voltage (Vss), hence the voltage of the output terminal OUT will be kept at a low-level voltage (Vss). The voltage between two ends of the capacitor C1 is the voltage difference of the first node N1 (Vdd−Vth1) and the output terminal OUT (Vss), i.e. (Vdd−Vth1−Vss).

Phase b:

When the input terminal IN is a low-level voltage (Vss), the second clock-pulse terminal CKB is also a low-level voltage (Vss) at this time. The first clock-pulse terminal CK changes to a high-level voltage (Vdd). Meanwhile, the voltage of the first node N1 will rise again from (Vdd−Vth1) to (Vdd−Vth1+ΔVp) due to the bootstrap effect. The output voltage of the output terminal OUT will rise from a low-level voltage (Vss) to a high-level voltage (Vdd).

Because, the input terminal IN changes to a low-level voltage (Vss) at this time, so the first transistor T1 cuts off resulting from the input terminal IN is a low-level voltage (Vss); the second transistor T2 cuts off resulting from the reset terminal RT is a low-level voltage (Vss); the sixth transistor T6 cuts off resulting from the second clock-pulse terminal CKB is a low-level voltage (Vss); the fourth transistor T4 turns on resulting from the first clock-pulse terminal CK is a high-level voltage (Vdd). And the fifth transistor T5 turns on resulting from the voltage of the first node N1 is (Vdd−Vth1+ΔVp). However, because the element size W/L of the fifth transistor T5 is much larger than the element size W/L of the fourth transistor T4, so even the fourth transistor T4 turns on, the voltage of the second node N2 is still kept at a low-level voltage (Vss).

Meanwhile, because the voltage of the second node N2 is a low-level voltage (Vss), so the third transistor T3 and the eighth transistor T8 are cut-off. Moreover, the ninth transistor T9 cuts off resulting from the second clock-pulse signal is a low-level voltage (Vss). But the source of the ninth transistor T9 connects to the first clock-pulse terminal CK that is a high-level voltage (Vdd) at this time, so the bias condition for the gate-source voltage (Vgs9) of the ninth transistor T9 is a negative bias.

In the beginning of this phase, the initial voltage of the first node N1 is (Vdd−Vth1). But the first transistor T1, the second transistor T2, and the third transistor T3 are all cut-off such that the first node N1 is at a floating state now. In addition, the eighth transistor T8 and the ninth transistor T9 are also cut-off, as a result, when the first clock-pulse terminal CK rises from a low-level voltage (Vss) to a high-level voltage (Vdd), the output voltage of the output terminal OUT will rise up from the low-level voltage (Vss). Meanwhile, the voltage rise of the output terminal OUT will rise the voltage of the first node N1 through the capacitor C1, and keep the seventh transistor T7 at a turn-on state. It is the bootstrap effect. This makes the voltage of the output terminal OUT to rise from the low-level voltage (Vss) to the high-level voltage (Vdd). The voltage of the first node N1 will also rise to (Vdd−Vth1+ΔVp), where ΔVp=[C1/(C1+$C_{N1}$)]×(Vdd−Vss), $C_{N1}$ is the parasitic capacitance of the first node N1.

Phase c:

When the first clock-pulse terminal CK changes to a low-level voltage (Vss), the second clock-pulse terminal CKB changes to the high-level voltage (Vdd), and the input terminal IN is a low-level voltage (Vss) continuously, the voltage of the first node N1 will drop from (Vdd−Vth1+ΔVp) to the low-level voltage (Vss), and the output voltage of the output terminal OUT will drop from a high-level voltage (Vdd) to a low-level voltage (Vss). At this time, the voltage of the reset terminal RT is supplied by the output signal of the output terminal OUT of the next-latter stage. Because the output signal of the output terminal OUT of the next-latter stage is a high-level voltage (Vdd), so the voltage of the reset terminal RT rises from the low-level voltage (Vss) to a high-level voltage (Vdd).

Because, the input terminal IN is still a low-level voltage (Vss) now, so the first transistor T1 cuts off resulting from the input terminal IN is a low-level voltage (Vss); the second transistor T2 turns on resulting from the reset terminal RT is a high-level voltage (Vdd); the fourth transistor T4 cuts off resulting from the first clock-pulse terminal CK is a low-level voltage (Vss); the sixth transistor T6 turns on resulting from the second clock-pulse terminal CKB is a high-level voltage (Vdd). At this time, because the first clock-pulse terminal CK is a low-level voltage (Vss) so the voltage of the second node N2 keeps at the low-level voltage (Vss). And the fifth transistor T5 and the seventh transistor T7 cut off resulting from the voltage of the first node N1 is a low-level voltage (Vss).

Meanwhile, because the voltage of the second node N2 is a low-level voltage (Vss), so the third transistor T3 cuts off. Besides, because the source of the third transistor T3 connects to the second clock-pulse terminal CKB, and the second clock-pulse terminal CKB is a high-level voltage (Vdd) at this time, so the bias condition for the gate-source voltage (Vgs3) of the third transistor T3 is a negative bias. Similarly, because the voltage of the second node N2 is a low-level voltage (Vss), so the eighth transistor T8 cuts off. Moreover, because the source of the eighth transistor T8 connects to the second clock-pulse terminal CKB, and the second clock-pulse terminal CKB is a high-level voltage (Vdd) at this time, so the bias condition for the gate-source voltage (Vgs8) of the eighth transistor T8 is a negative bias.

The ninth transistor T9 turns on due to the second clock-pulse terminal CKB is a high-level voltage (Vdd). At this time, the first clock-pulse terminal CK is a low-level voltage (Vss), hence the voltage of the output terminal OUT drops from a high-level voltage (Vdd) to a low-level voltage (Vss). The voltage between two ends of the capacitor C1 is zero resulting from both the voltages of the first node N1 and the output terminal OUT are the low-level voltage (Vss).

Phase d:

When the second clock-pulse terminal CKB changes to a low-level voltage (Vss), the first clock-pulse terminal CK changes to a high-level voltage (Vdd), and the input terminal IN is a low-level voltage (Vss) continuously, the voltage of the first node N1 will keep at the low-level voltage (Vss). Meanwhile, the output voltage of the output terminal OUT will also keep at the low-level voltage (Vss). At this time, the voltage of the reset terminal RT will drop from the high-level voltage (Vdd) to the low-level voltage (Vss).

Because, the input terminal IN is a low-level voltage (Vss) continuously in this phase, the first transistor T1 cuts off resulting from the input terminal IN is a low-level voltage (Vss); the second transistor T2 cuts off resulting from the reset terminal RT is a low-level voltage (Vss); the fourth transistor T4 turns on resulting from the first clock-pulse terminal CK is a high-level voltage (Vdd). Therefore, the voltage of the second node N2 rises from the low-level voltage (Vss) to (Vdd−Vth4). The sixth transistor T6 cuts off resulting from the second clock-pulse terminal CKB is a low-level voltage (Vss).

Meanwhile, because the voltage of the second node N2 is (Vdd−Vth4), so the third transistor T3 and the eighth transistor T8 turn on. Besides, because the source of the third transistor T3 connects to the second clock-pulse terminal CKB, and the second clock-pulse terminal CKB is a low-level voltage (Vss) at this time, so the voltage of the first node N1 keeps at the low-level voltage (Vss). Moreover, because the source of the eighth transistor T8 connects to the second clock-pulse terminal CKB, and the second clock-pulse terminal CKB is a low-level voltage (Vss) at this time, so the output voltage of the output terminal OUT keeps at the low-level voltage (Vss). And the fifth transistor T5 and the seventh transistor T7 cut off resulting from the voltage of the first node N1 is a low-level voltage (Vss).

The ninth transistor T9 cuts off due to the second clock-pulse terminal CKB is a low-level voltage (Vss). Moreover, because the source of the ninth transistor T9 connects to the first clock-pulse terminal CK that is a high-level voltage (Vdd) at this time, so the bias condition for the gate-source voltage (Vgs9) of the ninth transistor T9 is a negative bias. The voltage between two ends of the capacitor C1 keeps at zero.

Phase e:

When the first clock-pulse terminal CK changes from the high-level voltage (Vdd) in the former phase to a low-level voltage (Vss), the second clock-pulse terminal CKB changes to the high-level voltage (Vdd), and the input terminal IN is a low-level voltage (Vss) continuously, the voltage of the first node N1 will keep at the low-level voltage (Vss). At the same time, the output voltage of the output terminal OUT and the voltage of the reset terminal RT will also keep at the low-level voltage (Vss).

Because, the input terminal IN is still a low-level voltage (Vss) now, so the first transistor T1 cuts off resulting from the input terminal IN is a low-level voltage (Vss); the second transistor T2 cuts off resulting from the reset terminal RT is a low-level voltage (Vss); the fourth transistor T4 cuts off resulting from the first clock-pulse terminal CK is a low-level voltage (Vss); the sixth transistor T6 turns on resulting from the second clock-pulse terminal CKB is a high-level voltage (Vdd). At this time, because the first clock-pulse terminal CK is a low-level voltage (Vss) so the voltage of the second node N2 drops from (Vdd−Vth4) to the low-level voltage (Vss). And the fifth transistor T5 and the seventh transistor T7 cut off resulting from the voltage of the first node N1 is a low-level voltage (Vss).

Meanwhile, because the voltage of the second node N2 is a low-level voltage (Vss), so the third transistor T3 cuts off. Besides, because the source of the third transistor T3 connects to the second clock-pulse terminal CKB, and the second clock-pulse terminal CKB is a high-level voltage (Vdd) at this time, so the bias condition for the gate-source voltage (Vgs3) of the third transistor T3 is a negative bias. Similarly, because the voltage of the second node N2 is a low-level voltage (Vss), so the eighth transistor T8 cuts off. Moreover, because the source of the eighth transistor T8 connects to the second clock-pulse terminal CKB, and the second clock-pulse terminal CKB is a high-level voltage (Vdd) at this time, so the bias condition for the gate-source voltage (Vgs8) of the eighth transistor T8 is a negative bias.

The ninth transistor T9 turns on due to the second clock-pulse terminal CKB is a high-level voltage (Vdd). At this time, the first clock-pulse terminal CK is a low-level voltage (Vss), hence the voltage of the output terminal OUT keeps at the low-level voltage (Vss). The voltage between two ends of the capacitor C1 keeps at zero.

Based on the above description, the operating principle for the single stage of the shift register of the present invention could be understood. The circuit of this invention lets the output signal of the output terminal OUT be the shift of the input terminal IN according to the inputs of the input terminal IN, the reset terminal RT, the first clock-pulse terminal CK, and the second clock-pulse terminal CKB. The stages are connected in serial and send the output signals G1, G2, G3, G4, . . . to the gate lines in the panel so as to achieve the function of driving signal shift for the active display panel.

Figure 7:
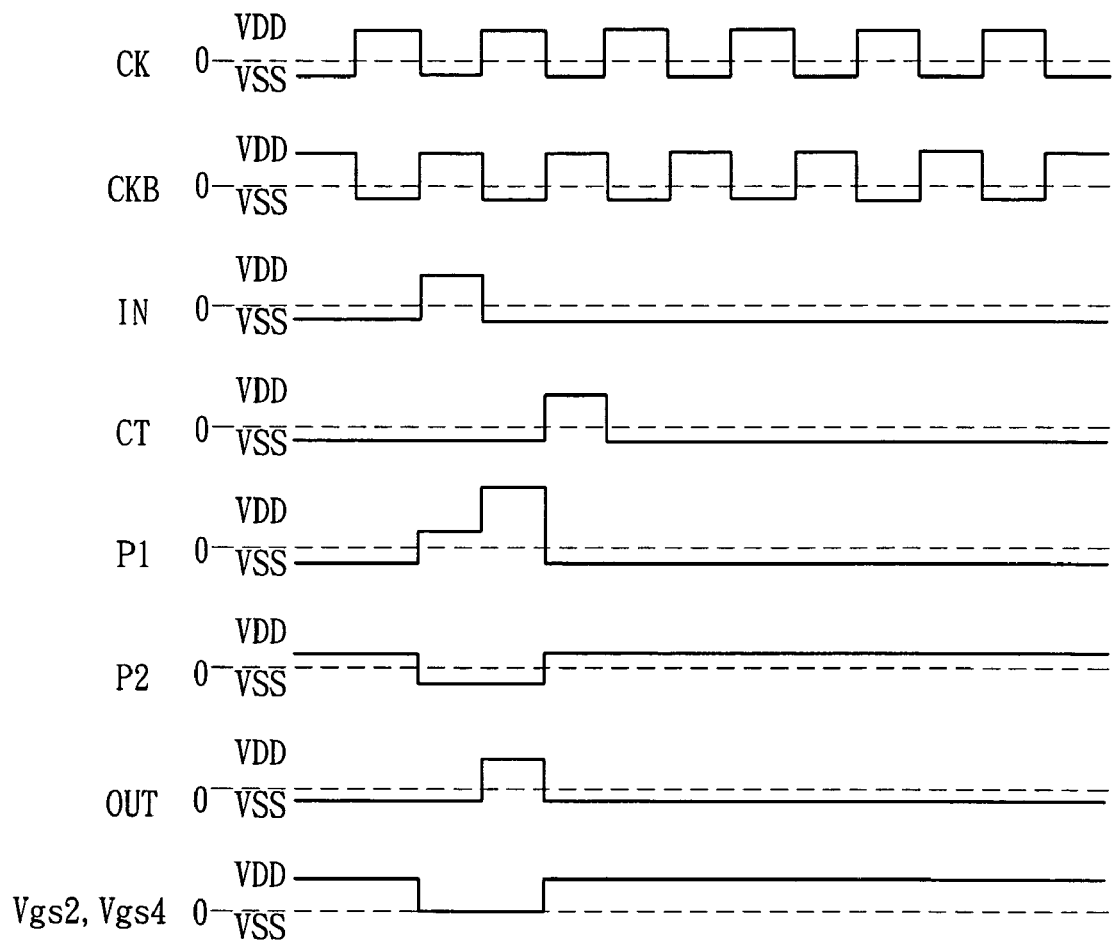
FIG. 7 is the timing diagram for FIG. 6.
Figure 8:
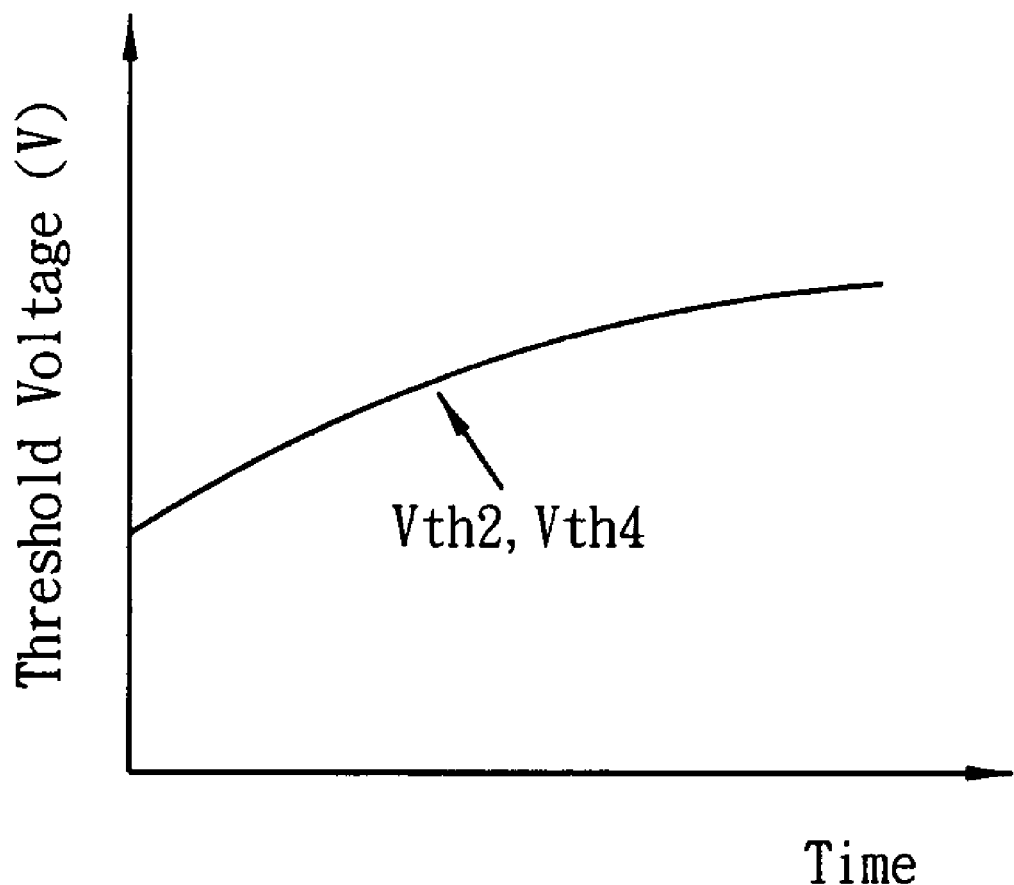
FIG. 8 depicts the variation of the threshold voltage that changes with time for transistors NT2 and NT4 of FIG. 6.

Besides, when the shift circuit of this invention is operating, input signals for the first clock-pulse terminal CK and the second clock-pulse terminal CKB are the out-of-phase signals: the first clock-pulse signal CLK and the second clock-pulse signal, which makes the driving conditions for the third transistor T3, the eighth transistor T8, and the ninth transistor T9 are positive/negative-alternating biases, as shown in FIG. 4. Especially for the eighth transistor T8 and the ninth transistor T9, except in the phase b, the two transistors are at an out-of-phase, positive/negative-alternating bias condition in the reset of the phases. Unlike the U.S. Pat. No. 6,690,347, the bias voltages for gate-source voltages Vgs2 and Vgs4 of the transistors NT2 and NT4 in the patent are zero for only two pulse-times. For the rest of the times, as shown in FIG. 7, the bias voltages for gate-source voltages Vgs2 and Vgs4 of the transistors NT2 and NT4 in the patent are extendedly at a positive-biased state.

Figure 5:
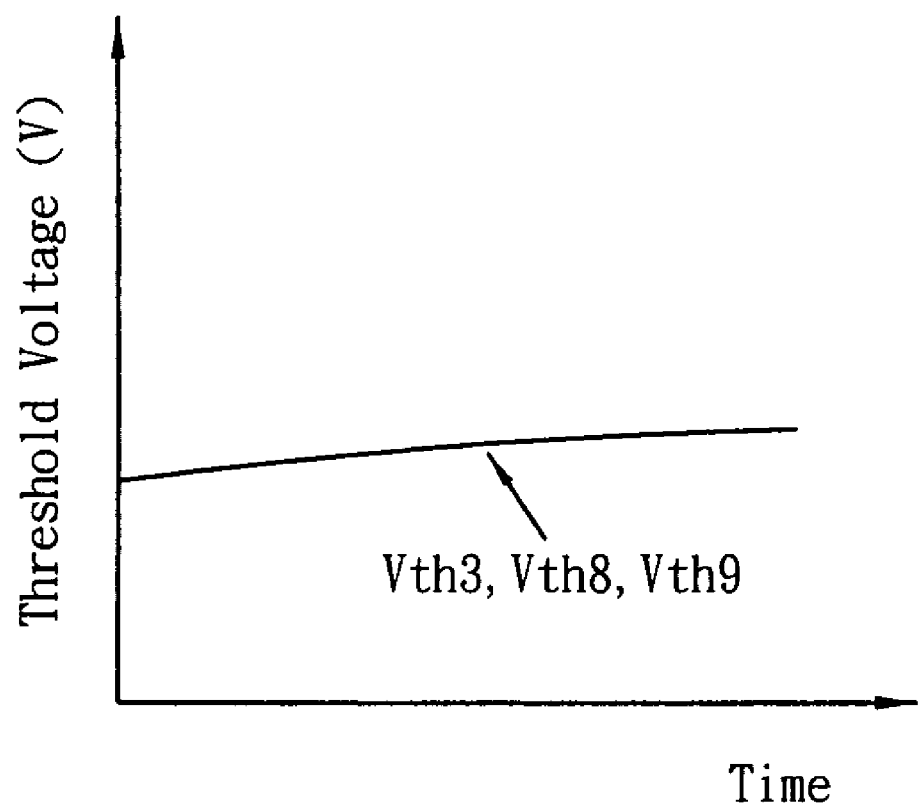
FIG. 5 depicts the variation of the threshold voltage that changes with time for transistors T3, T8, and T9 of the current invention.
Figure 6:
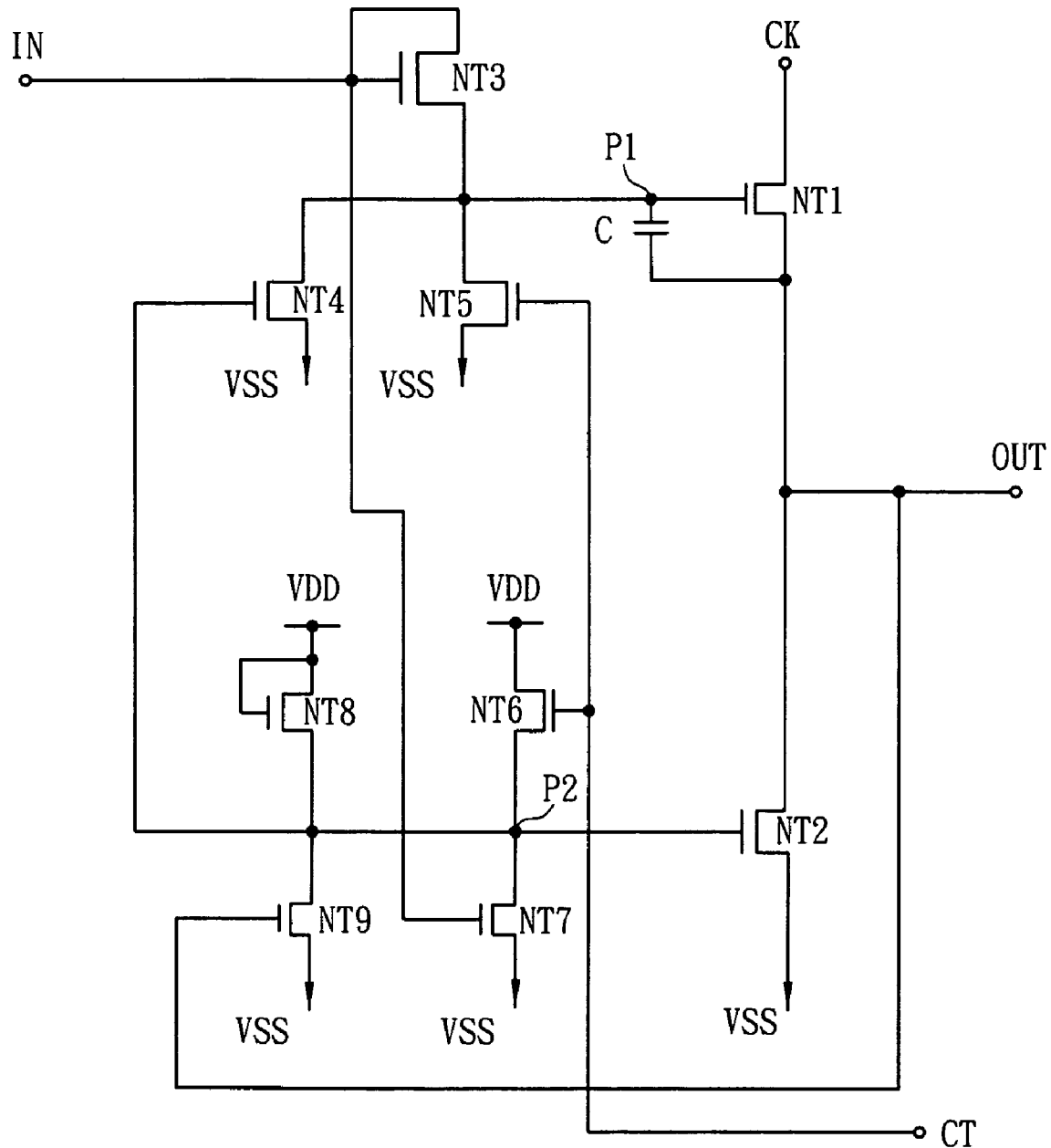
FIG. 6 is the schematic circuit for the U.S. Pat. No. 6,690,347.

Accordingly, the current invention makes the driving conditions for the third transistor T3, the eighth transistor T8, and the ninth transistor T9 are positive/negative-alternating biases so as to restrain the threshold voltage shift of the third transistor T3, the eighth transistor T8, and the ninth transistor T9 such that the threshold voltage of the transistors will not excessively increase along with the increasing operating time, as shown in FIG. 5.

As a result, the circuits show up in the current invention provide a recovery mechanism for restraining the threshold voltage shift of the a-Si TFT elements so as to enhance the stability of the scanning shift circuit, to increase the lifetime of the a-Si TFTs, and to extend the operating time of the shift circuit. It also avoids that the a-Si TFTs affect the scanning signal of the shift register due to the threshold voltage shift.

However, the above description is only a better practice example for the current invention, which is not used to limit the practice scope of the invention. All equivalent changes and modifications based on the claimed items of this invention are in the scope of the present invention.

What is claimed is:

1. A high-stability shift circuit using amorphous silicon thin film transistors is applied to shift register circuits that are composed of amorphous silicon thin film transistors, and stages are connected in serial and send the output signals to the gate lines in the panel;

initially, a serial-start signal is fed into a first stage, and input signals for the rest stages are from the output signal of the next-former stage individually; a first clock-pulse terminal and a second clock-pulse terminal for odd stages of the shift register circuit are respectively supplied by the first clock-pulse signal and the second clock-pulse signal that are out-of-phase to each other; an input terminal of the odd stage also includes a reset terminal that receives the output signal of the next-latter stage; and each odd stage of the stages comprising of:

a first transistor whose gate connects to the input terminal and the drain connects to a high-level supply voltage;

a second transistor whose gate connects to the reset terminal, the source connects to the first clock-pulse terminal, and the drain and the source of the first transistor form a first node;

a third transistor whose drain connects to the first node and the source connects to the second clock-pulse terminal;

a fourth transistor whose gate connects to the first clock-pulse terminal, the drain connects to the high-level supply voltage, and the source and the gate of the third transistor form a second node;

a fifth transistor whose gate connects to the first node, the drain connects to the second node, and the source connects to a low-level supply voltage;

a sixth transistor whose gate connects to the second clock-pulse terminal, the drain connects to the first clock-pulse terminal, and the source connects to the second node;

a seventh transistor whose gate connects to the first node, the drain connects to the first clock-pulse terminal, the source connects to an output terminal;

a capacitor is connected between the first node and the output terminal;

an eighth transistor whose gate connects to the second node, the drain connects to the output terminal, and the source connects to the second clock-pulse terminal; and a ninth transistor whose gate connects to the second clock-pulse terminal, the drain connects to the output terminal, and the source connects to the first clock-pulse terminal.

2. The high-stability shift circuit using amorphous silicon thin film transistors as claimed in claim 1, wherein the input clock-pulse signal for the first clock-pulse terminal of the even stage changes to the second clock-pulse signal, and the input clock-pulse signal for the second clock-pulse terminal of the even stage changes to the first clock-pulse signal.

3. The high-stability shift circuit using amorphous silicon thin film transistors as claimed in claim 1, wherein the size ratio for the fifth transistor to the fourth transistor is approximately 5:1.

4. The high-stability shift circuit using amorphous silicon thin film transistors as claimed in claim 1, wherein the capacitor is charged through the source of the first transistor, and the first transistor is controlled by the input signal.

5. The high-stability shift circuit using amorphous silicon thin film transistors as claimed in claim 1, wherein the capacitor is discharged through the second transistor, and the second transistor is controlled by the input signal of the reset terminal.

* * * * *